United States Patent [19]
Uemoto

[11] Patent Number: 5,389,799
[45] Date of Patent: Feb. 14, 1995

[54] SEMICONDUCTOR DEVICE

[75] Inventor: Tsutomu Uemoto, Yokohama, Japan

[73] Assignee: Kabushiki Kaisha Toshiba, Kawasaki, Japan

[21] Appl. No.: 74,541

[22] Filed: Jun. 11, 1993

[30] Foreign Application Priority Data

Jun. 12, 1992 [JP] Japan .................. 4-152577
Aug. 7, 1992 [JP] Japan .................. 4-211082
Mar. 15, 1993 [JP] Japan .................. 5-53459

[51] Int. Cl.⁶ .............. H01L 29/48; H01L 23/48; H01L 29/161; H01L 29/167
[52] U.S. Cl. ................... 257/77; 257/472; 257/607; 257/616; 257/744
[58] Field of Search ............. 257/77, 472, 607, 609, 257/610, 612, 616, 655, 744, 768

[56] References Cited

U.S. PATENT DOCUMENTS

| 4,161,743 | 7/1979 | Yonezawa et al. | 257/77 |
| 5,063,421 | 11/1991 | Suzuki et al. | 257/77 |
| 5,200,805 | 4/1993 | Parsons et al. | 257/77 |
| 5,210,430 | 5/1993 | Taniguchi et al. | 257/77 |

OTHER PUBLICATIONS

Journal of the Electrochemical Society, vol. 111 (1964), pp. 805–810; L. B. Griffiths, et al., "Growth of Alpha-SiC Single Crystals from Chromium Solution".

Journal of the Electrochemical Society, vol. 112 (1965), pp. 1114–1116, M. A. Wright, "The Growth of Alpha-SiC from Various Chromium Alloys by a Travelling Solvent Method".

Primary Examiner—Mark V. Prenty
Attorney, Agent, or Firm—Oblon, Spivak, McClelland, Maier & Neustadt

[57] ABSTRACT

Disclosed is a semiconductor device such as a light emitting diode, a MOS transistor, a Schottky diode, and CCD. The semiconductor device comprises a SiC layer of a first conductivity type and another SiC layer of a second conductivity type. At least one of the SiC layers of the first and second conductivity types is doped with at least one element selected from the group consisting of Cr, Mo and W.

15 Claims, 7 Drawing Sheets

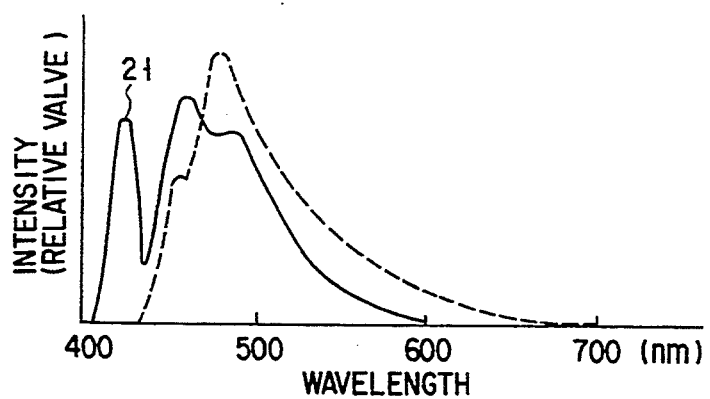
F I G. 2
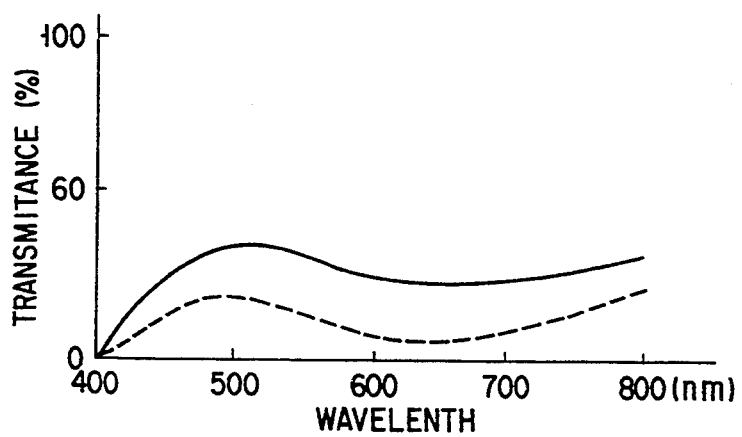
F I G. 3
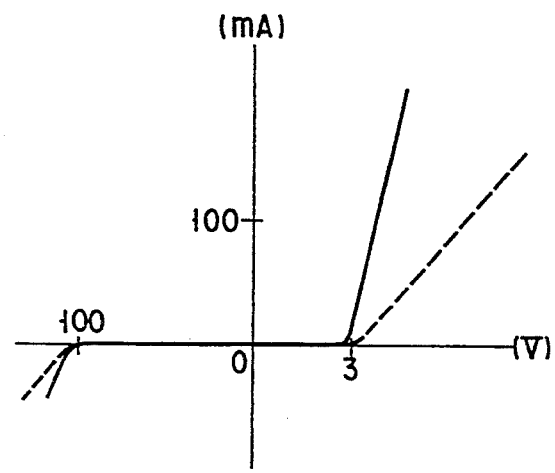
F I G. 4
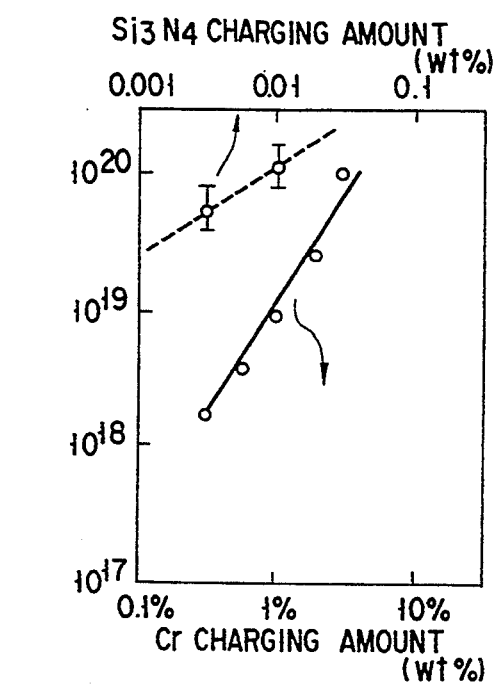
F I G. 5

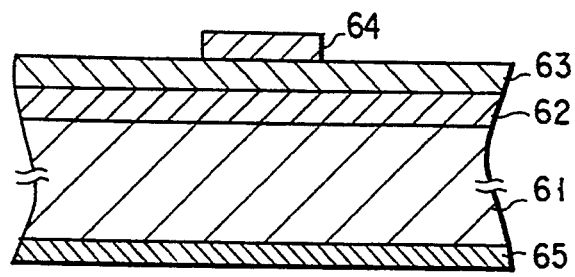
F I G. 6
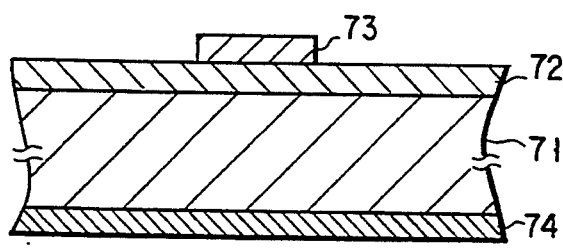
F I G. 7
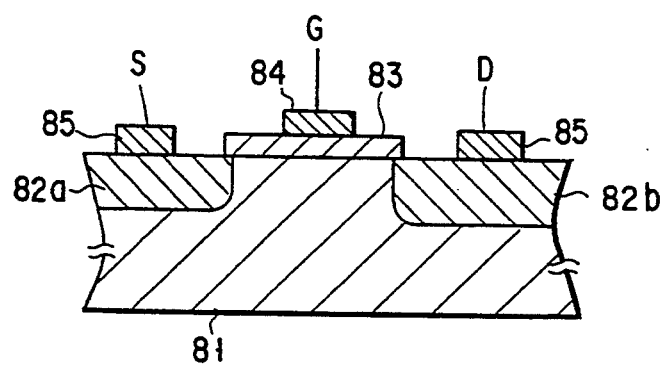
F I G. 8
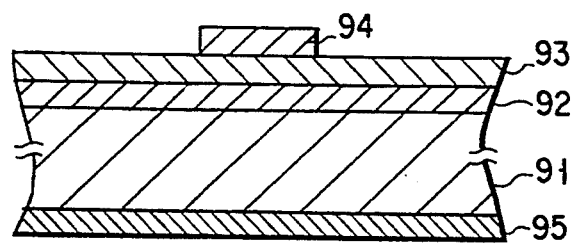
F I G. 9

$Si_2H_6, C_2H_2$
$Al(CH_3)_3$

SEMICONDUCTOR DEVICE

BACKGROUND OF THE INVENTION

1. Field of the Invention

The present invention relates to a semiconductor device comprising a semiconductor layer containing carbon as a constituent element.

2. Description of the Related Art

A IV group semiconductor containing carbon as a constituent element, particularly SiC, has such a wide band gap as 2.2 to 3.2 eV and, thus, is expected to provide a useful material in the development of a visible light LED or a high speed switching device operating under a high voltage. Particularly, LED of a p-n junction type using the IV group semiconductor permits emitting a blue light and, thus, vigorous researches are being made in an attempt to develop LEDs of a practical level in the field of the visible light LED.

Since the band structure of SiC is of an indirect transition type, the light emission from a LED including a SiC layer must accompany absorption and emission of phonons, with the result that the transition probability between bands for the light emission is very low. Thus, transition between donor (D) and acceptor (A) is utilized in the conventional LED using SiC. A device utilizing the transition between D and A is featured in that the wavelength of the emitted light differs depending on the distance between the lattice positions occupied by D and A. To be more specific, the conventional LED using SiC is defective in that the color tone of the emitted light is rendered poor because the light emitted from the LED has a wide wavelength region. What should also be noted is that, in the case of the D-A pair light emission, the peak wavelength of the emitted light differs depending on the magnitude of current flowing through the LED. In other words, the color of the emitted light is changed by the magnitude of current flowing through the LED, leading to a serious problem that the display characteristics of a full color LED display element are deteriorated.

It should also be noted that SiC has a wide band gap, as pointed out above. Thus, the energy level of the impurity serving to determine the conductivity type is deep. For example, the energy level of nitrogen (N) SiC has such a deep energy level as about 100 meV. Such being the situation, where SiC is doped with N as a donor impurity, the carrier activation rate relative to the impurity concentration is low. For example, only about 10% of the impurities are activated. It follows that, in order to achieve an n-type crystal growth of a high carrier concentration, it is necessary to set the concentration of the doped impurity at a level scores of times as high as the carrier concentration.

On the other hand, an acceptor impurity Al has such a large activation energy as 200 meV within SiC and, thus, the activation rate is as low as only about 1%. It follows that, in order to achieve a p-type crystal growth of a high carrier concentration, it is necessary to set the concentration of the doped impurity at a level hundreds of times as high as the carrier concentration.

Under the circumstances, extra defects are generated in the case of obtaining an n- or p-type layer of a high carrier concentration. What should be noted is that these extra defects cause marked deterioration in the electrical and optical properties of SiC.

As a doping method which permits overcoming the defects described above, proposed is a technique of forming a shallow impurity level by using a complex center so as to obtain a p-type layer. In this technique, however, it is very difficult to select a suitable dopant.

An additional technique is reported in, for example, "Journal of the Electrochemical Society, III, page 805 (1964)". It is reported that a p-type layer and an n-type layer are obtained by the crystal growth from a solution containing Cr as a main component. In this technique, however, a large amount of Cr exceeding a level of a dopant is considered to remain in the semiconductor crystal, leading to a low crystallity. As a result, the resistivity of the semiconductor layer is not lowered, making the technique impractical, though it is certainly possible to increase the carrier concentration in the semiconductor layer.

As described above, it is difficult to obtain a satisfactory n- or p-type semiconductor layer containing carbon as a constituent element in the conventional semiconductor element, giving rise to the problems that the device is deteriorated by heat generation and that the external quantum efficiency is lowered. Particularly, when it comes to the conventional SiC light emitting device, the color tone of the emitted light is deteriorated by the expansion of the width of the light emission peak. Also, a color change is brought about because the peak wavelength of the emitted light is changed by the magnitude of current flowing through the light emitting device. What should also be noted is that it is difficult to form a p- or n-type layer of a low resistivity in the conventional SiC light emitting device, with the result that the light emitting region of the LED using SiC is restricted to a region close to the electrode. In this case, the emitted light is intercepted by the electrode, leading to a low extraction efficiency of the emitted light.

SUMMARY OF THE INVENTION

An object of the present invention is to overcome the above-noted problems inherent in the prior art so as to provide a semiconductor device comprising a p- or n-type semiconductor layer containing carbon as a constituent element, said semiconductor layer having a high carrier concentration and exhibiting a low resistivity.

According to an aspect of the present invention, there is provided a semiconductor device, comprising a first semiconductor layer of a first conductivity type, said first semiconductor layer containing carbon as a constituent element; and a second semiconductor layer of a second conductivity type, said second semiconductor layer being formed on the first semiconductor layer and containing carbon as a constituent element; wherein an element selected from the group consisting of Cr, Mo, and W is doped in at least one of the first and second semiconductor layers.

According to another aspect of the present invention, there is provided a semiconductor device, comprising a semiconductor layer of one conductive type containing carbon as a constituent element and doped with an element selected from the group consisting of Cr, Mo, and W; and a metal layer formed on the surface of said semiconductor layer.

According to another aspect of the present invention, there is provided a semiconductor device, comprising a first semiconductor layer of a first conductivity type, said first semiconductor layer containing carbon as a constituent element; and a second semiconductor layer of a second conductivity type, said second semiconductor layer being formed on the first semiconductor layer and containing carbon as a constituent element; wherein at least one of the first and second semiconductor layers is doped with at least one element selected from the group consisting of Cr, Mo and W.

According to still another aspect of the present invention, there is provided a semiconductor device, comprising a semiconductor layer of one conductive type containing carbon as a constituent element and doped with at least one element selected from the group consisting of Cr, Mo and W; and a metal layer formed on the surface of said semiconductor layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a graph showing the relationship between the wavelength and the intensity of the light emitted from the light emitting diode according to the first embodiment of the present invention as well as the particular relationship for the conventional light emitting diode;

FIG. 3 is a graph showing the relationship between the wavelength and the light transmittance of the light emitting diode layers according to the first embodiment of the present invention as well as the particular relationship for the conventional light emitting diode;

FIG. 4 is a graph showing the voltage-current characteristics of the light emitting diode according to the first embodiment of the present invention as well as the particular relationship for the conventional light emitting diode;

FIG. 5 is a graph showing the relationship between the additive introducing amount and the carrier concentration of n-type layer of the light emitting diode according to the first embodiment of the present invention as well as the particular relationship for the conventional light emitting diode;

FIG. 6 is a cross sectional view showing the construction of a light emitting diode according to a second embodiment of the present invention;

FIG. 7 is a cross sectional view showing the construction of a light emitting diode according to a third embodiment of the present invention;

FIG. 8 is a cross sectional view showing the construction of a MOS type transistor according to a fourth embodiment of the present invention;

FIG. 9 is a cross sectional view showing the construction of a light emitting diode according to a fifth embodiment of the present invention;

DETAILED DESCRIPTION OF THE PREFERRED EMBODIMENTS

Figure 1A:
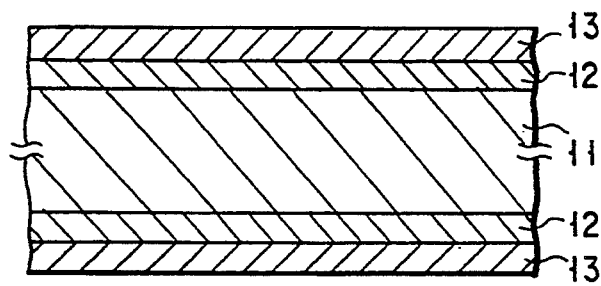
FIGS. 1A to 1D are cross sectional views collectively showing the manufacturing steps of a light emitting diode according to one embodiment of the present invention.

As a result of an extensive research on the crystal growth of a IV group semiconductor containing carbon such as SiC or diamond, the present inventors have found that, in the case of adding Cr, Mo or W to the semiconductor in a semiconductor device, it is possible to obtain prominent effects even if the carrier concentration is as high as $10^{20}/cm^3$. To be more specific, it has been found that, even under the high carrier concentration noted above, the light absorption within the crystal is not noticeably increased, and that the color tone is not deteriorated. It has also been found that the wavelength of the emitted light is not shifted by the change in magnitude of current flowing through the light emitting device.

It was customary in the past to understand that an element selected from the group consisting of Cr, Mo and W, which has a deep energy level, fails to provide a satisfactory impurity which is to be added to Si. However, it has been found through the researches conducted by the present inventors that the group VIa element has a shallow energy level within a semiconductor containing carbon as a constituent element such as SiC or diamond.

It is known to the art that a SiC film or a diamond film is likely to be affected by the air atmosphere during the crystal preparation step. It is considered reasonable to understand that the element Cr, Mo and W within a group IV semiconductor layer containing carbon as a constituent element forms a complex center together with the component of air, i.e., nitrogen or oxygen, or with carbon so as to form a shallow energy level.

Under the circumstances, it is possible to obtain a LED which exhibits a high light transition probability between bands and, thus, permits a high light emission efficiency. It is also possible to achieve a high carrier concentration with a low impurity concentration because the group VIa element exhibits a markedly high activation rate as a donor.

It has also been clarified by the present inventors that, in the case of growing a p-type layer from a Si solvent in a liquid phase growth method, it is possible to obtain a strong p-type layer by adding Cr, Mo or W to the Si solvent. Further, it has been clarified by the present inventors that, in the case of growing an n-type layer from a Si solvent, it is possible to obtain a strong n-type layer by adding a group VIa element such as Cr, Mo or W to the Si solvent.

What has also been clarified by the researches conducted by the present inventors is that, if a group VIa element is added together with a group III element or with a group V element in the growth of a semiconductor layer containing carbon as a constituent element such as SiC or diamond, the element Cr, Mo as well as W forms a shallow level.

According to the analysis of the impurities contained in a semiconductor layer, the group via element introduced into the semiconductor layer is distributed in a highly localized manner. Since it is unreasonable to understand that the localized impurity distribution permits improving the electrical characteristics of the semiconductor device, it is considered reasonable to understand that the element Cr, Mo as well as W serves to neutralize the defect or to perform a catalytic function so as to make it possible to obtain a strong p-type layer or a strong n-type layer.

The semiconductor device according to a first aspect of the present invention comprises a first semiconductor layer of a first conductivity type, said first semiconductor layer containing carbon as a constituent element; and a second semiconductor layer of a second conductivity type, said second semiconductor layer being formed on the first semiconductor layer of the first conductivity type and containing carbon as a constituent element. It is important to note that a group via element is doped in at least one of the first and second semiconductor layers included in the semiconductor device of the present invention.

On the other hand, the semiconductor element according to a second aspect the present invention comprises a semiconductor layer of one conductive type containing carbon as a constituent element and doped with Cr, Mo or W; and a metal layer formed on the surface of said semiconductor layer.

The element used in each of the first and second aspects of the present invention is a member selected from the group consisting of Cr, Mo and W. It is most desirable to use Cr.

The doping amount of the via group element should fall within a range of between $1\times10^{15}/cm^3$ and $5\times10^{19}/cm^3$, preferably between $1\times10^{16}/cm^3$ and $1\times10^{18}/cm^3$. If the doping amount is smaller than $1\times10^{15}/cm^3$, it is difficult to obtain a desired effect. On the other hand, if the doping amount exceeds $5\times10^{19}/cm^3$, atoms of the group via element enter the semiconductor crystal other than the lattice points, with the result that dislocation and polycrystallization are likely to take place easily.

In the semiconductor element of the present invention, it is possible for the semiconductor layer doped with Cr, Mo or W to be doped with a group III element and/or a group V element together with Cr, Mo or W. In this case, the semiconductor layer exhibits a further improved p-type conductivity or n-type conductivity. The group III elements used in the present invention include, for example, B, Al, Ga and In. On the other hand, the group V elements used in the present invention include, for example, N, P, As and Sb. A group II element such as Zn can be doped in place of or together with the group III element. Furthermore, a group VI element such as Se can be doped in place of or together with the group V element.

In the semiconductor element according to the first or second aspect of the present invention, an i-conductivity type semiconductor layer or an insulating layer may be interposed between the semiconductor layers of the first conductivity and the second conductivity type.

Let us describe various embodiments of the present invention with reference to the accompanying drawings. Specifically, FIGS. 1A to 1D are cross sectional views collectively showing the fabricating process of a light emitting diode constituted by SiC:Cr according to the first embodiment of the present invention. A liquid phase epitaxy (LPE) method was employed for the growth of a SiC crystal layer. In the embodiment shown in the drawings, the first conductivity type was provided by an n-type, with the second conductivity type being provided by a p-type. Further, an n-type SiC layer was doped with a donor impurity of Cr, which is a group VIa element, with a concentration of $1\times10^{19}/cm^3$.

As shown in FIG. 1A, an n-type SiC layer 12, which is a group IV semiconductor containing carbon as a constituent element, is grown first in a thickness of 10 μm by a LPE method on the surface of an n-type 6H SiC substrate 11 having the (0001) basal plane constitutes a principal plane. The n-type SiC layer 12 thus grown is doped with Cr, which is a group via element, and traces of Al which forms a light emission center. The Al doping in this embodiment is intended to obtain a blue light emission. After formation of the n-type SiC layer 12, a p-type SiC layer 13, which is a group VI semiconductor containing carbon as a constituent element, is grown in a thickness of about 10 μm. The p-type SiC layer 13 is doped with Al as an acceptor.

Figure 1B:
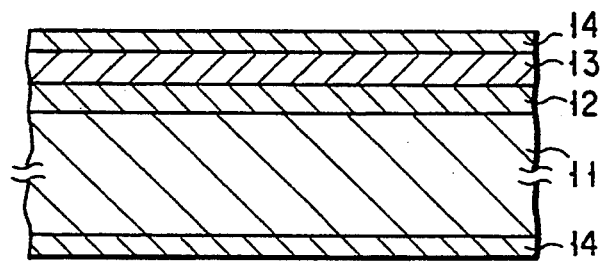
Figure 1C:
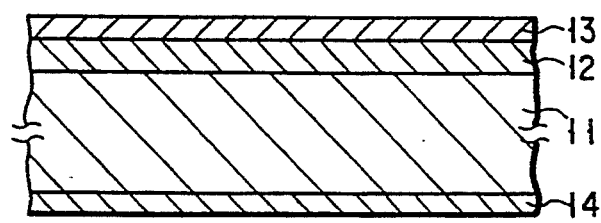
Figure 1D:
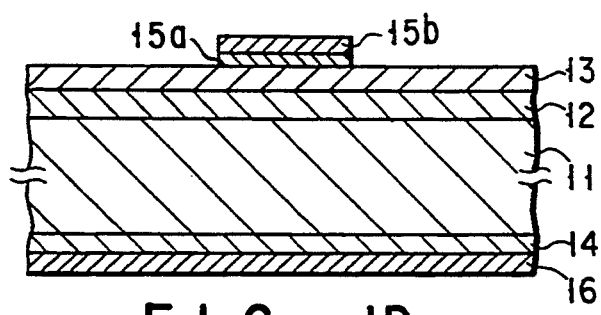

In the next step, the n-type SiC layer 12 and the p-type SiC layer 13 grown on the back surface of the SiC substrate 11 are removed by lapping, followed by growing an n-type SiC layer 14, which is a group IV semiconductor containing carbon as a constituent element, in a thickness of 2 μm, as shown in FIG. 1B. The SiC layer 14 has a high impurity concentration and is doped with Cr. Further, the n-type SiC layer 14 having a high impurity concentration, which is formed on the p-type SiC layer 13, is removed by lapping so as to expose the p-type SiC layer 13. Then, a Ti layer 15a and an Al layer 15b, which collectively form an electrode 15, are successively formed by a vacuum vapor deposition method on the p-type SiC layer 13, as shown in FIG. 1D. On the other hand, a Ni layer 16 is formed by a vacuum vapor deposition on the surface of the n-type SiC layer 14. Then, the Ti/Al layer 15 so as to form an electrode pattern. After the patterning step, the structure is subjected to a heat treatment at 1,000° C. for 2 minutes so as to achieve an ohmic contact between the electrode and the undercoat layer. It should be noted that the structure consisting of the Cr-doped n-type SiC layer 12 and the p-type SiC layer 13 corresponds to the first aspect of the present invention. Likewise, the structure consisting of the Cr-doped n-type SiC layer 14 and the Ni layer 16 corresponds to the second aspect of the present invention.

FIG. 2 shows the light emission spectrum of the LED. A solid line shown in FIG. 2 denotes the LED of the embodiment shown in FIG. 1, with a broken line denoting the conventional LED which is substantially equal to the LED of the present invention except that Cr is not added to the semiconductor layer and N is added as a donor impurity. As apparent from FIG. 2, the conventional LED emits light having a peak wavelength around 470 nm and a broad wavelength region longer than 470 nm, with the result that the light emitted from the conventional LED looks whitish blue. In the LED of the present invention, however, a strong light emission is obtained in a wavelength region about 460 nm. Also obtained is a light emission peak 21 in a wavelength region shorter than 460 nm. As a result, the LED of the present invention emits a blue light having a visual impression better than the blue light emitted from the conventional LED. When the current intensity within the conventional LED was changed in an attempt to observe a change in the color of the emitted light, the entire graph denoted by the broken line in FIG. 2 was shifted to and from depending on the change in the current intensity so as to bring about a great change in the color of the emitted light. In the LED of the present invention manufactured by the process shown in FIG. 1, however, no shifting was recognized in the light emission peak 21 regardless of the change in the current intensity. Also, the color as a whole of the light emitted from the LED remained substantially unchanged. What should also be noted is that it was possible to control the intensity of the light emitted from the LED of the present invention by suitably controlling the intensity of the current flowing through the LED.

FIG. 3 shows the relationship between the wavelength of the light and the transmittance through an epitaxially grown n-type SiC layer included in each of the LED of the present invention and the conventional LED. A solid line shown in FIG. 3 denotes the LED of the present invention, with a broken line denoting the conventional LED. The n-type SiC layer included in the LED of the present invention was doped with Cr with a carrier concentration of $10^{19}/cm^3$. On the other hand, n-type SiC layer in the conventional LED was doped with N with a carrier concentration of $10^{19}/cm^3$. It should be noted that the impurity concentration of the n-type SiC layer, i.e., nitrogen concentration, was as high as $1 \times 10^{20}$ atoms/$cm^3$ in the conventional LED. However, the Cr concentration in the n-type SiC layer included in the LED of the present invention was as low as only about $1 \times 10^{19}$ atoms/$cm^3$, i.e., one tenth of the N concentration in the conventional LED. In other words, substantially all the Cr atoms contained in the n-type SiC layer are activated in the LED of the present invention.

Also, in the n-type SiC layer included in the conventional LED, the color of the film was found to be greenish. Particularly, the light absorption was found to be large in the blue color region and the red color region. When it comes to the n-type SiC layer included in the LED of the present invention, however, the light transmittance was found to be about two times as much as that through the n-type SiC layer included in the conventional LED, as seen from FIG. 3.

FIG. 4 shows the voltage-current characteristics in respect of each of the LED of the present invention and the conventional LED. A solid line in FIG. 4 denotes the voltage-current characteristics for the LED of the present invention, with a broken line denoting the voltage-current characteristics for the conventional LED.

In the conventional LED, a contact resistance is high between the n-type substrate and the electrode, leading to a high built-in voltage of the diode. Also, the current increase is not sufficiently high under the voltage higher than the buile-in voltage. It should be noted that the high contact resistance noted above causes a heat generation within the diode, with the result that it is practically impossible to operate the diode under a high current density. The high contact resistance also causes a significant power loss, leading to reduction in the power efficiency.

On the other hand, the LED of the present invention exhibits ideal diode characteristics, indicating that the electrode included in the LED permits reducing the contact resistance between the electrode and the SiC semiconductor layer. As a matter of fact, the contact resistance of the electrode included in the LED of the present invention was found to be less than one tenth the contact resistance for the conventional LED. It should be noted that, in forming an electrode on the n-type SiC layer included in the semiconductor element according to the second aspect of the present invention, it is possible to improve the ohmic contact property by using an n-type SiC layer doped with Cr. In this case, an ohmic electrode can be formed without employing a heat treatment.

Then, an n-type SiC layer doped with Cr was grown by a LPE method so as to examine the relationship between the introducing amount and the carrier concentration, with the result as shown in FIG. 5. A solid line in FIG. 5 denotes the relationship between the introducing amount and the carrier concentration for the embodiment of the present invention, in which the n-type SiC layer was grown with Cr used as a donor impurity, with a broken line denoting the particular relationship for the conventional case, in which the n-type SiC layer doped with N was grown using $Si_3N_4$ as a dopant.

As apparent from FIG. 5, the carrier concentration is increased to reach about $10^{20}/cm^3$ in the conventional case when the introducing amount of $Si_3N_4$ is increased to reach only 0.3% by weight. What should be noted is that it is very difficult to weigh accurately the amount of silicon nitride required for forming an epitaxial layer of a low carrier concentration. In other words, it is very difficult to control accurately the introducing amount of silicon nitride where it is intended to form an epitaxial layer having such a low carrier concentration as $10^{18}/cm^3$ to $10^{17}/cm^3$. In the case of using Cr as in the present invention, however, the carrier concentration can be controlled relatively easily because the activation rate of the chromium atoms introduced into the SiC semiconductor layer is high, though the amount of chromium atoms which are actually introduced into the SiC layer is small relative to the introducing amount.

FIG. 6 is a cross sectional view showing a LED according to the second embodiment of the present invention. In the LED shown in FIG. 6, the first conductivity type is an n-type, with the second conductivity type being a p-type. Also, the n-type SiC layer is doped with Cr, which is a group via element and acts as a donor impurity.

The LED shown in FIG. 6 is prepared by forming an n-type SiC layer 62 doped with Cr in a concentration of $1 \times 10^{19}/cm^3$ on the surface of a p-type SiC substrate 61, followed by forming on the surface of the n-type SiC layer 62 an n-type SiC layer 63 doped with a high concentration of Cr. The LED also comprises a Ni electrode 64 and a Ti-Al electrode 65. These electrodes 64 and 65 are brought into ohmic contact with the SiC layers by a heat treatment. It should be noted that the combination of the p-type SiC substrate 61 and the Cr-doped n-type SiC layer 62 included in the LED shown in FIG. 6 corresponds to the first aspect of the present invention. Likewise, the combination of the n-type SiC layer 63 and the Ni electrode 64 corresponds to the second aspect of the present invention. Naturally, the embodiment shown in FIG. 6 produces an effect similar to that produced by the first aspect described previously.

FIG. 7 is a cross sectional view showing a diamond light emitting element according to the third embodiment of the present invention. As seen from the drawing, a Cr-doped n-type diamond film 72 is grown on the surface of a p-type diamond substrate 71 by a hot filament CVD method. The Cr doping can be achieved by heating a solid Cr body disposed upstream of a raw material gas. A platinum paste electrode 73 is formed as an n-side electrode, with a silver paste electrode 74 being formed as a p-side electrode. Further, these electrodes 73 and 74 are brought into ohmic contact with the diamond layers by a heat treatment. Chromium acting as a donor impurity is introduced into the n-type diamond film 72 acting as a light emitting layer. This makes it possible to form an n-type diamond layer easily, though it was difficult in the past to prepare an n-type diamond layer. In addition, it has been confirmed that the light emitting efficiency can be improved. Of course, the embodiment shown in FIG. 7 also produces an effect similar to that produced by the first embodiment described previously.

FIG. 8 is a cross sectional view showing the construction of a MOS type transistor according to a fourth embodiment of the present invention, said MOS type transistor being prepared by using SiC. As seen from the drawing, the MOS type transistor comprises a p-type SiC substrate 81 containing Ga, and n-type source and drain regions 82a, 82b formed by ion-implanting As and Cr into the substrate 81. A $SiO_2$ film 83 is formed to cover the surface of the substrate by a known CVD method. The MOS type transistor also comprises a gate electrode 84 formed of aluminum, and ohmic electrodes 85 each consisting of a Cr film. These Cr electrodes 85 are brought into an ohmic contact with the source region 82a and with the drain region 82b each consisting of n-type SiC.

The characteristics of the p-channel MOS transistor of the construction shown in FIG. 8 have been examined. It has been found that it is possible to suppress markedly the electrical resistance of the source electrode 82a and the drain electrode 82b. Further, the MOS transistor has been found to be markedly superior in the switching speed and the power consumption to the conventional MOS transistor in which the source and drain regions are not doped with Cr. In this fashion, the technical idea of the present invention can be widely employed for the formation of an ohmic electrode in various semiconductor devices other than LED, not to mention the LED itself.

In the present invention, a group IV semiconductor layer containing carbon as a constituent element is doped with Cr, Mo and/or W as an impurity, as described previously. In addition, it is possible for the group IV semiconductor layer to be doped with the conventional acceptor impurity of a group III element such as N, P, or As or the conventional donor impurity of a group V element such as B, Al, Ga or In together with the via group element noted above. Of course, it is possible to select freely a desired combination of these impurities so as to obtain a LED of a high efficiency.

It should also be noted that, where the group IV semiconductor layer containing carbon as a constituent element is doped with a group VIa element alone, e.g., Cr alone, the light emission peak on the side of a shorter wavelength region forms the center, making it possible to obtain a LED which emits a purple light. Also, where a light emitting layer is formed of a p-type layer, it is possible to obtain a sufficient effect of the present invention by doping the p-type layer with an acceptor impurity such as aluminum together with a group via element such as chromium. In this case, it is necessary to control the doping amount of the group VIa element not to exceed the acceptor concentration. For example, it is possible to obtain a satisfactory light emitting layer by doping a p-type SiC layer with $2 \times 10^{19}/cm^3$ of Al as an acceptor impurity and $5 \times 10^{18}/cm^3$ of chromium as a group via element. What should also be noted is that, where the technical idea of the present invention is employed in the manufacture of various semiconductor devices, the metals used for forming the ohmic electrode include, for example, Cr, Ni, Ta and Mo.

Figure 10:
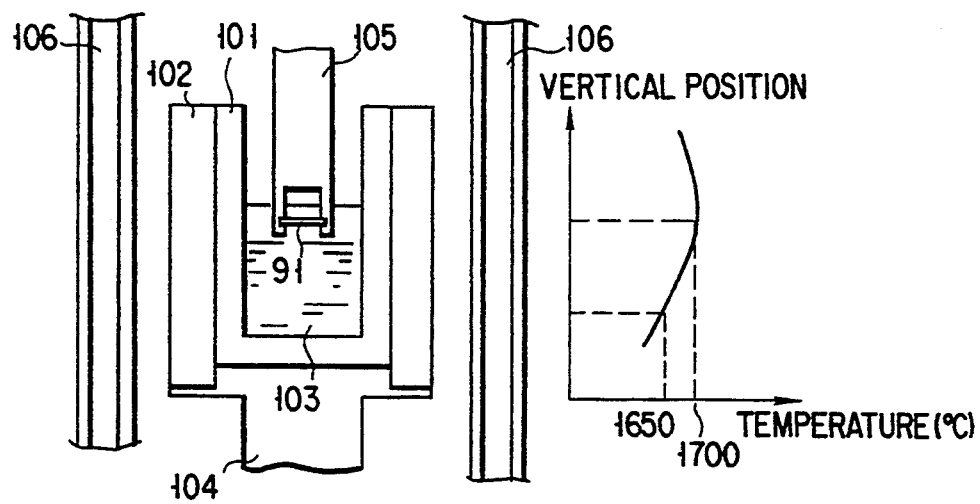
FIG. 10 shows a crystal growth apparatus used in the manufacture of a semiconductor device of the present invention.

FIGS. 9 and 10 are directed to a SiC light emitting diode according to the fifth embodiment of the present invention. To be more specific, FIG. 9 is a cross sectional view showing the SiC light emitting diode of the present invention. On the other hand, FIG. 10 shows an apparatus for a crystal growth by a liquid phase epitaxy (LPE) method. As shown in the drawing, the apparatus is controlled to exhibit a particular temperature gradient. It is seen that the LPE apparatus comprises a graphite crucible 101, a heat shield member 102, a silicon solvent 103, a graphite supporting member 104, a holder 105 and a water-cooling chamber 106.

In the first step, a polycrystalline silicon, 0.003% by weight based on the silicon amount of silicon nitride acting as a donor impurity, and 2% by weight based on the silicon amount of aluminum serving to form a light emitting center are put in the crucible 101 formed of a high purity graphite, followed by heating the mixture to 1650° C. As shown in the graph included in FIG. 10, the temperature distribution within the crucible 101 is controlled such that the central portion in the vertical direction of the crucible is set higher, and the temperature is gradually lowered toward each of the lower and upper regions of the crucible 101. Under this condition, an n-type 6H SiC crystal substrate 91, which is cut out along the (0001) plane, is disposed in the central portion of the crucible 101, and the substrate surface is etched. After the etching step, the substrate is disposed in the vicinity of the bottom of the crucible so as to achieve a crystal growth of an n-type SiC layer 92 shown in FIG. 9 in a thickness of 10 μm on the substrate surface.

In the next step, the crucible 101 is renewed, and the new crucible is charged with a polycrystalline silicon, 1% by weight of Cr based on the silicon amount as a group via element, and 2% by weight based on the silicon amount of aluminum as an acceptor impurity.

Under this condition, the new crucible is heated to 1650° C. As in the crystal growth for forming the n-type SiC layer 92, the n-type 6H SiC substrate 91 is disposed in the higher temperature region first and, then, in the lower temperature region within the crucible so as to achieve a crystal growth of a p-type SiC layer 93 doped with both Al and Cr in a thickness of about 10 μm, said p-type SiC layer 93 having a carrier concentration of $1 \times 10^{19}/cm^3$. In the method described above, an n-type epitaxial SiC layer and a p-type epitaxial SiC layer are formed on the front and back surfaces of the substrate 91. Thus, the epitaxial layer formed on the back surface of the n-type 6H SiC crystal substrate 91 is removed by lapping.

After formation of the p-type SiC layer 93, a Ti film and an Al film are formed in succession on the p-type SiC layer 93 by a vacuum vapor deposition so as to form an electrode 94. On the other hand, a Ni layer 95 is formed on the back surface of the n-type 6H SiC crystal substrate 91 by a vacuum vapor deposition, followed by patterning the Ni layer 95. Finally, the patterned Ni layer 95 is subjected to a heat treatment at 1000° C. for 2 minutes so as to achieve an ohmic contact and, thus, to form an electrode.

Figure 11:
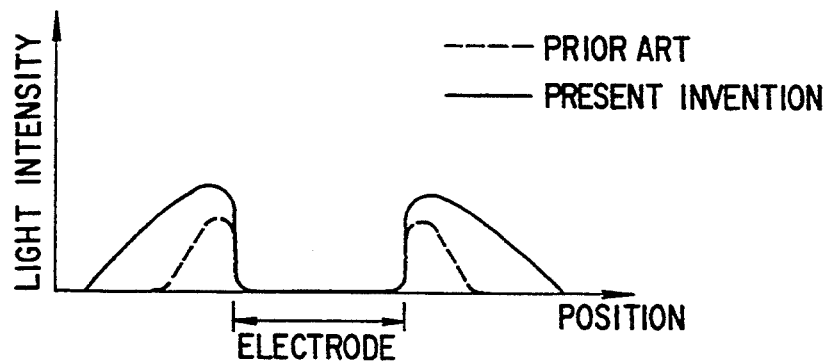
FIG. 11 shows the near field pattern of the light emitting diode according to the fifth embodiment of the present invention together with that of the conventional light emitting diode.

FIG. 11 is a graph showing a near field pattern of the light from a light emitting diode. A solid line in FIG. 11 covers the light emitting diode of the present invention, with a broken line denoting a conventional light emitting diode in which the p-type layer was doped with aluminum alone in contrast to the p-type layer doped with both chromium and aluminum as in the light emitting diode of the present.

It should be noted that the p-type layer included in the conventional light emitting diode has a high electrical resistivity. As a result, a light emission is obtained in only these regions which are close to the electrode, as apparent from FIG. 11. What should be noted that the light emitted from the conventional diode is intercepted by the electrode, leading to a low intensity of the light taken out of the diode. In the light emitting diode of the present invention, however, the light emitting region expands laterally from the electrode, leading to a strong intensity of the light taken out of the diode.

In addition, the p-type layer included in the conventional light emitting diode was found to have a considerably high resistivity. Naturally, the high resistivity causes a heat generation, with the result that it was practically impossible to operate the diode with a reasonably high current density. On the other hand, the light emitting diode of the present invention was found to improve the various properties noted above, making it possible to prepare a light emitting diode having a low resistivity which was difficult to prepare in the past.

Figure 12:
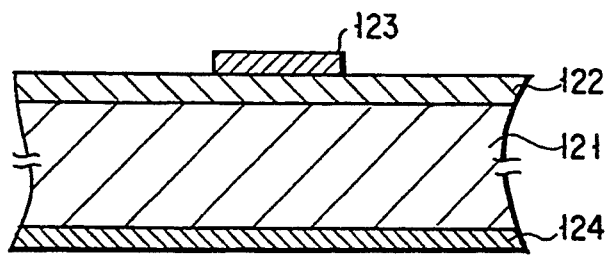
FIG. 12 is a cross sectional view showing the construction of a Schottky diode according to a sixth embodiment of the present invention.

FIG. 12 is a cross sectional view showing the construction of a Schottky diode according to the sixth embodiment of the present invention. The apparatus shown in FIG. 10 was used for manufacturing the diode shown in FIG. 12.

For manufacturing the Schottky diode shown in FIG. 12, an n-type SiC layer 122 was formed by means of an epitaxial growth on the surface of an n-type 6H SiC crystal substrate 121. In this case, nitrogen acting as a donor impurity and chromium which is a group VIa element were added at the same time to a silicon solvent. The carrier concentration in this embodiment was set at $1 \times 10^{17}/cm^3$.

In the next step, a Ni layer was formed by means of a vacuum vapor deposition on the back surface of the n-type 6H SiC crystal substrate 121, followed by applying a heat treatment to the nickel layer so as to form an ohmic electrode 124 consisting of a Ni alloy. Further, a gold layer was formed by means of a vacuum vapor deposition on the n-type SiC layer 122 so as to form a Schottky electrode 123.

Figure 13:
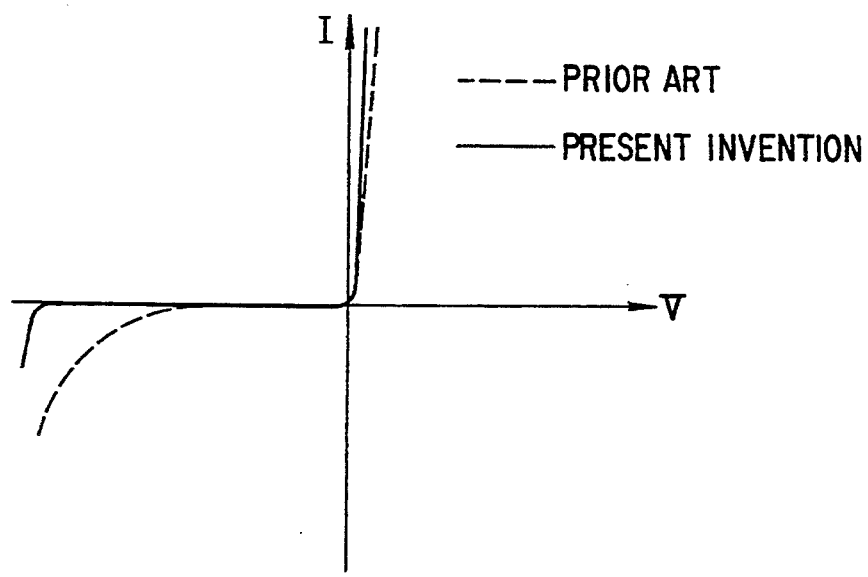
FIG. 13 is a graph showing the voltage-current characteristics of the Schottky diode according to the sixth embodiment of the present invention together with those of the conventional Schottky diode.

FIG. 13 is a graph showing the current-voltage characteristics of the Schottky diode. A solid line in FIG. 13 denotes the Schottky diode of the present invention described above, with a broken line denoting the conventional Schottky diode in which an n-type layer of the carrier concentration same as that in the present invention was formed by adding nitrogen alone as an impurity in contrast to the present invention in which both chromium and nitrogen were added to the n-type layer.

As apparent from FIG. 13, the Schottky diode of the present invention is superior to the conventional Schottky diode in the breakdown characteristics in the reverse direction. It should be noted in this connection that Cr used in the present invention serves to increase the activation rate of the donor impurity of nitrogen, with the result that undesired impurity atoms are not held within the SiC crystal. It follows that it is possible to suppress the crystal defects of the n-type SiC layer 122 so as to produce the prominent effect described above.

The Schottky diode shown in FIG. 12, which utilizes a Schottky junction, can also be used as a detector of ultra violet rays. It should be noted that the Schottky diode constructed as shown in FIG. 12 permits lowering the nitrogen impurity concentration to about one tenth of the level in the conventional Schottky diode. In addition, the Schottky diode of the present invention permits markedly improving the sensitivity to ultra violet rays and, thus, can be effectively used as a detector of ultraviolet rays.

Figure 14:
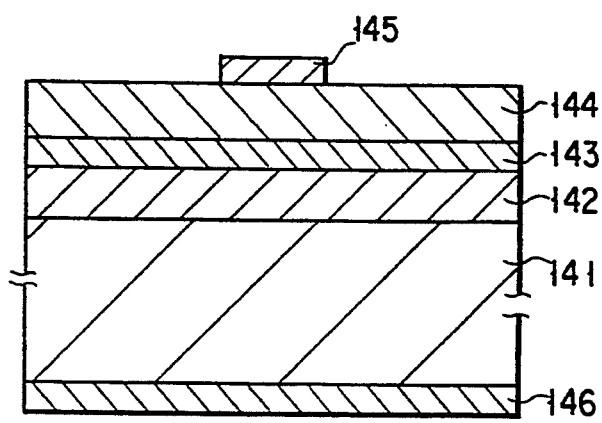
FIG. 14 is a cross sectional view showing a double hetero structure type light emitting diode using $(AlN)_x$-$(SiC)_y$ according to a seventh embodiment of the present invention.

FIG. 14 is a cross sectional view showing the construction of a double hetero structure type light emitting diode using $(AlN)_x(SiC)_y$ according to the seventh embodiment of the present invention. The apparatus shown in FIG. 10 was used for preparing the diode shown in FIG. 14.

In the first step, an n-type layer 142 consisting of $(AlN)_{0.6}(SiC)_{0.4}$ was formed on an n-type 6H SiC crystal substrate 141 by means of an epitaxial growth technique. In this step, a donor impurity of N and a VIa group element of Cr were added to the n-type layer 142 to have a carrier concentration of $1 \times 10^{18}/cm^3$. Then, an active layer 143 consisting of $(AlN)_{0.5}(SiC)_{0.5}$ and having a carrier concentration of $1 \times 10^{16}/cm^3$ was formed on the n-type layer 142 by means of an epitaxial growth technique, followed by forming a p-type layer 144 consisting of $(AlN)_{0.6}(SiC)_{0.4}$ and having a carrier concentration of $1 \times 10^{18}/cm^3$ on the active layer 143 by means of an epitaxial growth technique. In this step, an acceptor impurity of Al and a VIa group element of Cr were added to the p-type layer 144. Further, a Ti layer and an Al layer were successively formed on the p-type layer 144 by means of a vacuum vapor deposition. On the other hand, a Ni layer was formed on the back surface of the n-type 6H SiC crystal substrate by means of a vacuum vapor deposition, followed by patterning these metal layers and subsequently applying a heat treatment at 1000° C. for 2 minutes so as to form ohmic junctions and, thus, to obtain electrodes 145 and 146.

The particular technique of the present invention described above makes it possible to increase the carrier concentration in each of the n- and p-type layers, though it was difficult in the past to form n- and p-type layers having a high carrier concentration. It follows that the particular technique of the present invention permits forming a double hetero structure of a high light emission efficiency.

Figure 15:
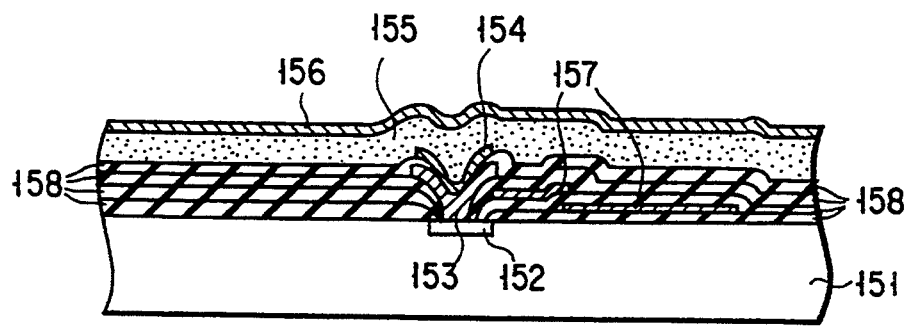
FIG. 15 is a cross sectional view showing a UV CCD according to an eighth embodiment of the present invention.

FIG. 15 is a cross sectional view showing the construction of a UV CCD according to an eighth embodiment of the present invention. In preparing the UV CCD shown in FIG. 15, an n-type region 152 is formed first in a surface region of a p-type SiC crystal substrate 151, followed by forming a thermal oxide film on the crystal substrate 151. Then, a hole is selectively formed in that portion alone of the thermal oxide film which is positioned on the n-type region 152, followed by forming a platinum electrode 153, which is an ohmic electrode, to fill the hole thus formed. In the next step, a semiconductor layer 154 consisting of an n-type amorphous SiC which contains a donor impurity of N and a group VIa element of Cr is formed on the platinum electrode 153, followed by forming an n-type layer 155 having a high resistivity and compensated by Al.

Further, an amorphous layer 156 consisting of a crystal mixture of AlN and SiC, said crystal mixture having a wide band gap, is formed on the n-type layer 155 having a high carrier concentration. In this step, a donor impurity of N and a group VIa element of Cr are added to the amorphous layer 156. A reference numeral 157 shown in FIG. 15 denotes a charge transfer gate, with a reference numeral 158 denoting an insulating film consisting of silicon oxide.

It should be noted that, among the layers included in the apparatus shown in FIG. 15, the semiconductor layer 154 consisting of an n-type amorphous SiC containing a donor impurity of N and a group VIa element of Cr and the amorphous layer 156 consisting of a crystal mixture of AlN and SiC permit lowering the resistance of the apparatus. It should also be noted that the UV CCD of the present invention shown in FIG. 15 exhibits a high sensitivity and is transparent to a visible light, making it possible to catch a picture image over a wide wavelength region by employing a laminate structure with a visible CCD.

Figure 16:
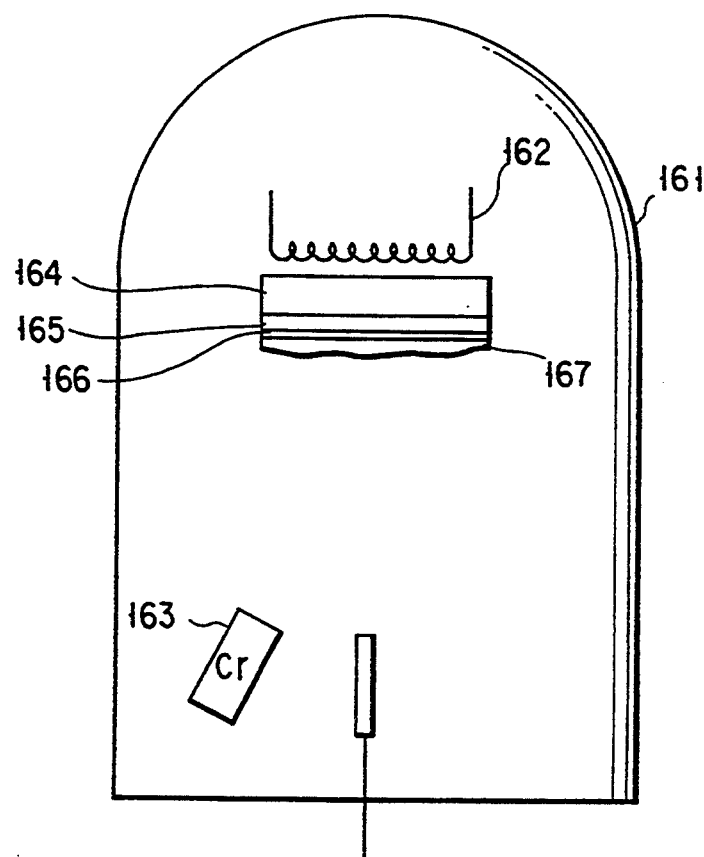
FIG. 16 shows an apparatus for growing a SiC layer by a MBE method according to one embodiment of the present invention.

The semiconductor element of the present invention comprises a semiconductor layer of a low resistivity. In order to form a semiconductor layer of a low resistivity, a SiC layer is grown by, for example, a MBE method. FIG. 16 shows a crystal growth apparatus employing the MBE method. As shown in the drawing, the apparatus comprises a chamber 161, a heater 162 and a Cr source 163.

For forming a SiC layer of a low resistivity, a SiC substrate 165 is disposed on a susceptor 164. A Cr layer 166 is grown to form several atomic layers stacked on the SiC substrate 165. After the Cr layer growth, a mixed gas consisting of an acetylene gas and a disilane and a dopant gas of trimethyl aluminum are supplied into the chamber 161 so as to achieve growth of a SiC layer 167. A surface segregation phenomenon takes place in this step in respect of the Cr layer. To be more specific, the Cr layer is segregated onto the growing surface of the SiC layer 167. However, some of the chromium atoms are left within the crystal of the SiC layer 167, with the result that the growing SiC layer contains both the acceptor impurity of Al and the group VIa element of Cr. The resultant SiC layer thus grown exhibits a p-type conductivity and has a high carrier concentration.

Figure 17:
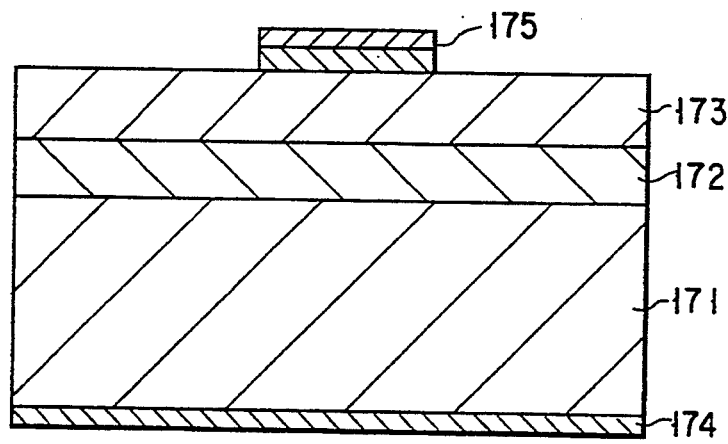
FIG. 17 is a cross sectional view showing the construction of an LED according to a ninth embodiment of the present invention.
Figure 18:
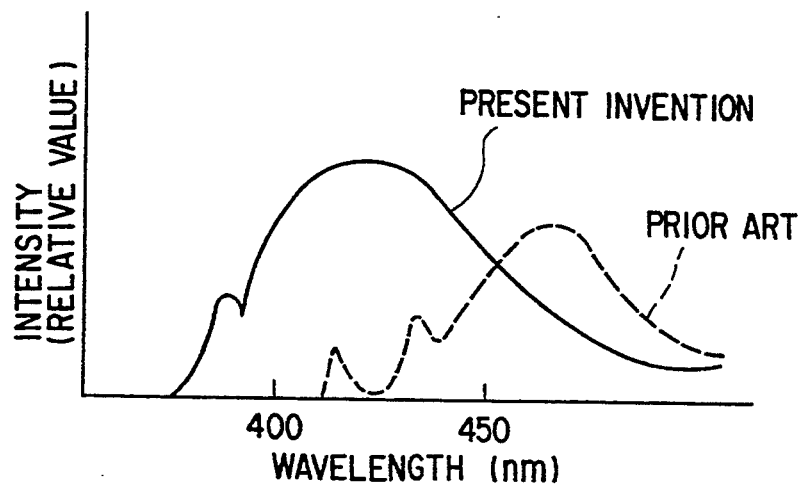
FIG. 18 is a graph showing the relationship between the wavelength and the intensity of the light emitted from the light emitting diode according to the ninth embodiment of the present invention as well as the particular relationship for the conventional light emitting diode.

FIG. 17 shows an LED according to a ninth embodiment of the present invention, which comprises an n-type layer containing Ti and Cr. The crystal growth apparatus shown in FIG. 10 was used for preparing the LED shown in FIG. 17. In the first step, 1% by weight of Cr and 2% by weight of Ti were added to a Si solvent for growing an n-type layer 172 on an n-type 6H SiC substrate 171 at 1650° C., followed by growing in another crucible a p-type layer 173 containing Al as an acceptor impurity on the n-type layer 172. After formation of the p-type layer 173, the epitaxial layer grown on the back surface of the substrate was removed by polishing. Then, a Ni layer 174 was formed by vacuum vapor deposition on the back surface of the n-type 6H SiC substrate 171. On the other hand, a Ti layer and an Al layer were successively formed in this order on the p-type layer 173 by vacuum vapor deposition, followed by patterning a laminate structure of these Ni and Al layers and subsequently applying a heat treatment to the patterned structure at 1000° C. for 2 minutes so as to form an electrode 175 having an ohmic junction.

The LED thus prepared was found to emit light of a wavelength shorter than that of light emitted from the conventional LED. Specifically, the light emitted from the LED shown in FIG. 17 was found to be purple or near ultraviolet. It was difficult in the past to add Ti to the n-type layer 172. However, Ti is added together with Cr in the present invention. In other words, the Cr addition permits addition of Ti to the n-type layer 172. The simultaneous addition of Ti and Cr are considered to permit growth of 4H or 2H type single crystal having a band gap larger than that of 6H type, leading to emission of purple light. In short, the present invention makes it possible to prepare an LED which emits a purple light, though it was difficult in the past to prepare such an LED.

The present invention is not restricted to the embodiments described above. For example, a group VIa element such as Cr, Mo or W is used as an additive element in the present invention. In the present invention, however, it is also possible to use the conventional donor element of the group V element such as as N, P, As, or Sb in combination with the group via element noted above. It is also possible to use the conventional acceptor element of the group III element such as B, Al, Ga or In in combination with the group VIa element noted above. Since these additives can be used freely in a desired combination, it is possible to provide a semiconductor device of a high efficiency, which does not contain an extra impurity.

Further, the present invention can be embodied in the form of various other modifications.

As described above in detail, the present invention provides a semiconductor device comprising a p-type or n-type semiconductor layer having a high carrier concentration and a low resistivity and, thus, greatly contributes to the improvement in the performance of various semiconductor devices comprising such semiconductor layers. It should also be noted that the present invention provides a group IV semiconductor element which permits markedly improving the color tone and which also permits suppressing the change in color regardless of the density of current flowing through the semiconductor layer. In particular, the present invention permits improving the display characteristics of a full color LED display device and also permits markedly widening the range of colors which can be displayed. Further, the technical idea of the present invention makes it possible to provide an ohmic contact between a semiconductor layer and a metal layer with a very low resistivity, leading to a marked improvement in the characteristics of the group IV semiconductor light emitting device.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device, comprising a first semiconductor layer of a first conductivity type, said first semiconductor layer containing carbon as a constituent element; and a second semiconductor layer of a second conductivity type, said second semiconductor layer being formed on the first semiconductor layer and containing carbon as a constituent element; wherein Cr is doped in at least one of the first and second semiconductor layers.

2. The semiconductor element according to claim 1, wherein Cr is doped in an amount of $1'10^{15}$ atoms/cm$^3$ to about $5 \times 10^{19}$ atoms/cm$^3$.

3. The semiconductor device according to claim 1, wherein at least one of said first and second semiconductor layers is doped with at least one element selected from the group consisting of the group III elements and the group V elements together with Cr.

4. The semiconductor device according to claim 3, wherein the group III element is at least one element selected from the group consisting of B, Al, Ga and In, and the group V element is at least one element selected from the group consisting of N, P, As and Sb.

5. The semiconductor device according to claim 1, wherein each of said first and second semiconductor layers is formed of carbon or a compound containing carbon and at least one element selected from the group consisting of Si, Ge, Sn and Pb.

6. The semiconductor device according to claim 1, wherein each of said first and second semiconductor layers is formed of SiC or GeC.

7. The semiconductor device according to claim 1, wherein said semiconductor device is selected from the group consisting of a light emitting diode and a MOS transistor.

8. A semiconductor device, comprising a semiconductor layer formed of SiC and doped with Cr; and a metal layer formed on the surface of said semiconductor layer, said metal layer being in ohmic contact with said semiconductor layer, or said metal layer and said semiconductor layer forming a Schottky barrier therebetween.

9. A semiconductor device comprising a semiconductor layer formed of SiC and doped with at least one metal element selected from the group consisting of Cr, Mo and W in an amount of about $1 \times 10^{15}$ atoms/cm$^3$ to about $5 \times 10^{19}$ atoms/cm$^3$; and a metal layer formed on the surface of said semiconductor layer, said metal layer being in ohmic contact with said semiconductor layer, or said metal layer and said semiconductor layer forming a Schottky barrier therebetween.

10. A semiconductor device comprising a semiconductor layer formed of SiC and doped with at least one metal element selected from the group consisting of Cr, Mo and W and wherein said semiconductor layer is doped with at least one element selected from the group consisting of the group III elements and the group V elements together with said metal element; and a metal layer formed on the surface of said semiconductor layer, said metal layer being in ohmic contact with said semiconductor layer, or said metal layer and said semiconductor layer forming a Schottky barrier therebetween.

11. The semiconductor device according to claim 10, wherein the group III element is at least one element selected from the group consisting of B, Al, Ga and In, and the group V element is at least one element selected from the group consisting of N, P, As and Sb.

12. A semiconductor device comprising a semiconductor layer formed of SiC and doped with at least one metal element selected from the group consisting of Cr, Mo and W; and a metal layer formed on the surface of said semiconductor layer wherein said metal layer is formed of a metal selected from the group consisting of Ni, Pt, Cr, Al and Ti, said metal layer being in ohmic contact with said semiconductor layer, or said metal layer and said semiconductor layer forming a Schottky barrier therebetween.

13. The semiconductor device according to claim 9, wherein said semiconductor device is selected from the group consisting of a light emitting diode, a MOS transistor, a Schottky diode and CCD.

14. A semiconductor device, comprising a first semiconductor layer of a first conductivity type, said first semiconductor layer containing carbon as a constituent element; and a second semiconductor layer of a second conductivity type, said second semiconductor layer being formed on the first semiconductor layer and containing carbon as a constituent element; wherein at least one of the first and second semiconductor layers is doped with at least one element selected from Cr, Mo and W, and at least one element selected from the group consisting of the group II and the group VI.

15. A semiconductor device comprising a semiconductor layer formed of SiC and doped with at least one metal element selected from the group consisting of Cr, Mo and W wherein said semiconductor layer is doped with at least one element selected from the group II elements and the group VI elements; and a metal layer formed on the surface of said semiconductor layer, said metal layer being in ohmic contact with said semiconductor layer, or said metal layer and said semiconductor layer forming a Schottky barrier therebetween.

* * * * *